United States Patent [19]

Berry et al.

[11] 4,399,458

[45] Aug. 16, 1983

[54] SIGNAL PROCESSING SYSTEM

[75] Inventors: Peter J. Berry, Glasgow; John Y. C. Montgomery, Edinburgh, both of Scotland

[73] Assignee: Barr & Stroud Limited, Glasgow, Scotland

[21] Appl. No.: 264,831

[22] Filed: May 18, 1981

[30] Foreign Application Priority Data

May 22, 1980 [GB] United Kingdom ................. 8017014

[51] Int. Cl.³ ............................................. H04N 5/197
[52] U.S. Cl. .................................... 358/113; 307/311; 357/24; 358/160; 250/330; 377/62
[58] Field of Search ............... 358/113, 160, 162, 166, 358/167; 364/515; 357/24 LR; 307/221 D, 311

[56] References Cited

U.S. PATENT DOCUMENTS 4,228,465  10/1980  Stone ................................... 358/167

Primary Examiner—Howard Britton
Attorney, Agent, or Firm—Mason, Fenwick & Lawrence

[57] ABSTRACT

A signal processing system comprises an analogue shift register of the charge coupled type (24) fed from a sampling device (22) and controlled by a clock arrangement (26) having three independent clocks (26A, 26B and 26C). Clock (26A) determines the sampling rate of sampling device (22) and the rate at which such samples are clocked into register (24). Clock 26C determines the rate at which stored samples are clocked out of the register (24). Clocks 26A and 26C operate in the MHz range. Clock 26B operates in the KHz range and dictates the sample storage interval and clocks the stored samples through a number of storage sites in register (24) during the storage interval to reduce the adverse effects of geometrical and other inhomogeneities of the individual register sites on the individual stored samples.

4 Claims, 5 Drawing Figures

SIGNAL PROCESSING SYSTEM

This invention relates to analog signal processing systems that include delay and temporary storage of analogue information.

Systems of the kind referred to above are already in use in thermal imagers intermediate the video display device and the thermal infrared detector and they utilise analogue shift registers of the charge-coupled type such as are produced by the Fairchild company. In such charge coupled devices (CCDs) the input signal is sampled and each sampled clocked along a signal path as a charge packet which is stored in a succession of sites which form bits of the register. In order to minimise the size of the CCD to that which can be carried on a single chip the signal path is tortuous so that the geometrical disposition of one register site to another varies along the signal path. This gives rise to the known phenomenon that certain register sites, according to their geometrical disposition on the signal path, augment the stored charge packet therein by a factor dependent upon the storage time of the charge packet in that site. Additionally known CCDs suffer from the problem that certain register sites which are randomly distributed geometrically are formed of materials not precisely identical to those found at other register sites and this produces an unwanted variation in the charge packet stored therein.

Thus, the known CCDs suffer from two inherent problems both of which give rise to unwanted variations in the charge packets which are clocked through the CCDs.

In the context of thermal imagers where the analogue signals transmitted through the CCDs are video signals the inherent problems of the CCDs result in visually perceptible distortions on the video display device when the delay period introduced by the CCD is significant.

The present invention is concerned with an improved signal processing system incorporating a CCD in which the foregoing disadvantages are mitigated or obviated.

Accordingly, the present invention provides a signal processing system comprising an analogue shift register of the charge coupled type, clock means arranged for clocking samples of an input signal into the CCD shift register, for determining the storage time of the signal in the CCD shift register, and for clocking the signal out of the CCD shift register, wherein the number of samples of the input signal is less than the number of sites in the CCD shift register and during the storage time the clock means is arranged to clock the stored samples through at least some of the register sites unfilled during the clocking in period.

Conveniently, the CCD register has M number of sites and the number of samples of the input signal is N where N is less than M and the clock means is arranged to clock the stored samples through M-N number of sites during the storage time.

It will be appreciated that the present invention provides a simple yet effective arrangement for reducing the time period that any one sample or charge packet is retained in any one register site so that the undesirable effects of geometrical disposition of individual register sites are spread over a number of charge packets rather than being accumulated on a single charge packet and the undesirable effects of material inhomogeneities at different register sites are spread over several charge packets.

An embodiment of the present invention will now be described by way of example with reference to the accompanying drawings, in which FIG. 1 is an enlarged view of a CCD illustrating the tortuous nature of the signal path.

Figure 1:
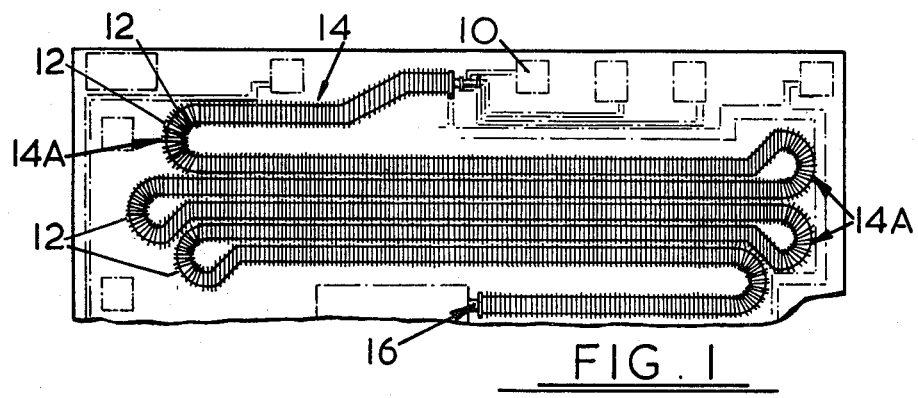
Figure 2:
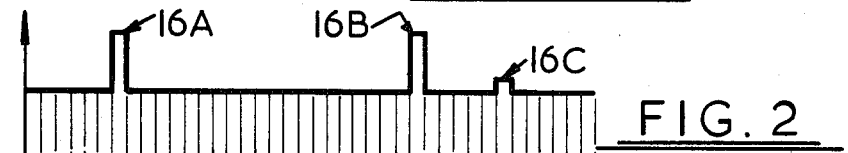
FIG. 2 is a waveform diagram illustrating the known undesirable effects arising from the inherent construction of the CCD of FIG. 1.

As shown in FIG. 1 a CCD 321A made by Fairchild has an input port 10 for receiving an input signal and a plurality of register sites 12 distributed along a signal path 14 which terminates at an output port 16. It will noted that the signal path has six folds 14A at each of which the geometrical disposition of the sites 12 differs from that of the sites 12 at other parts of the path 14. When an input signal of constant level is clocked into the device in sample form, stored for a time interval and then clocked out of the device the output waveform 16 is as shown in FIG. 2. Thus samples 16A, and 16B are of increased amplitude arising from these particular samples being stored as charge packets in register sites 12 located at two of the folds 14A. The waveform 16 is schematic for the purpose of illustration only and does not illustrate the fact that in practise the samples adjoining samples 16A and 16B would also be of slightly increased amplitude arising from the fact that each fold 14A contains a plurality of register sites 12. Inhomogeneities in the materials of the sites 12 also give rise to augmented sample amplitudes but of lesser amplitude augmentation than samples 16A, 16B and these are randomly distributed as illustrated at sample 16C.

Figure 3:
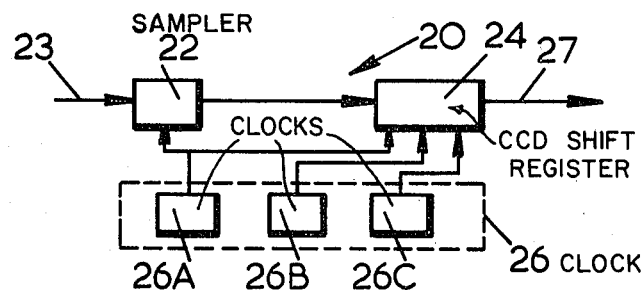
FIG. 3 is a block diagram of a signal processing system according to the present invention.

The system 20 which is illustrated in FIG. 3 comprises a sampling device 22 arranged to receive an analogue input signal on line 23 and deliver samples thereof to a CCD shift register 24 under the control of a clock arrangement 26. The device 22 is shown separately from the register 24 in the interests of clarity but usually these two components would be integrated in a single chip as is the case in the illustrated CCD 321A device. The clock arrangement 26 in effect comprises three individual clocks 26A, 26B, 26C, clock 26A being arranged to operate sampling device 22 and clock the samples into the register 24; clock 26B being arranged to clock the stored samples or charge packets generally through the register 24 during the storage period; and clock 26C being arranged to clock the samples out of the register 24 onto output line 27. Clocks 26A and 26C need not operate at the same rate but conveniently clock 26C operates faster than does clock 26A, both however conveniently operate in the MHz range. Clock 26B operates slower than either clock 26A or 26C and conveniently in the KHz range.

Figure 4:
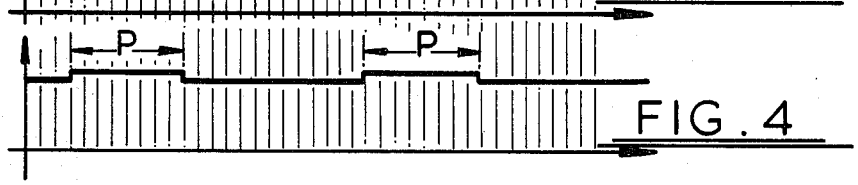
FIG. 4 is a waveform diagram illustrating the operation of the FIG. 3 system.

The system 20 is arranged so that the analogue input signal is of known length and therefore the number of samples produced by device 22 is known, say N. The register 24 is provided with M sites where M is greater than N by say P (ie. $N+P=M$) and clock 26B is arranged to move the stored samples through P number of register sites during the storage interval. As a consequence the augmentation of any one stored charge packet is reduced by a factor of P but instead of only one or two charge packets being affected (ie. samples 16A, 16B) one or two sets of P in number charge packets are affected. Thus the magnitude of the distortion in the output waveform 30 shown in FIG. 4 is reduced but sets of charge packets (or samples) P in number are affected.

Figure 5:
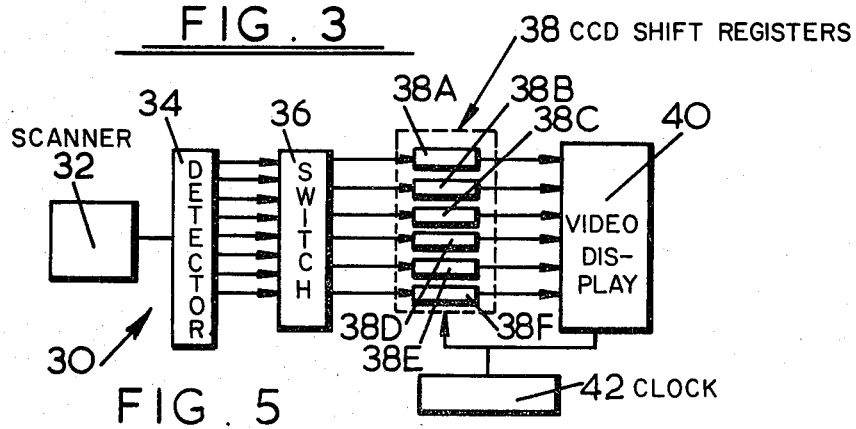
FIG. 5 illustrates a thermal imager incorporating a signal processing system according to the present invention.

A thermal imager 30 is illustrated in FIG. 5 incorporating the system of the present invention. Imager 30 comprises a scanner 32 which scans lines of an image scene onto a detector 34 which has a column of n detector elements. The n outputs (say eight) are fed in parallel to a switching device 36 which directs a number of these outputs, conveniently four, to selected ones of six CCD shift registers 38 operating in sampling mode, the outputs of which are fed to a video device 40 for display purposes. A clock arrangement 42 is illustrated generically, being associated with each of the individual registers 38A, 38B . . . 38F in the manner of FIG. 3. The arrangement operates so that switching device 36 feeds the first set of four signals from the detector 34 to the first four registers 38A, 38B, 38C, 38D. The signal in register 38A has zero storage time, whilst register 38B has a storage time equal to that of one line scan (IT) of the video device 40; register 38C has a storage time of 2T and register 38D a register time of 3T. The next set of four signals received by switching device 36 are respectively entered in registers 38E, 38F, 38A and 38B since the time delay in delivery of these signals by the scanner 32 and detector 34 is sufficient for registers 38A and 38B to have been cleared into the video device 40. The next set of four signals received by switching device 36 can be directed to registers 38C, 38D, 38E and 38F and so on.

Where the clocking in rate of a CCD is a limiting factor this can be enhanced by multiplexing the input signal into a plurality of identical CCDs arranged in parallel, the delayed signal being reestablished by demultiplexing.

It will be appreciated that in the thermal imager of FIG. 5, because the ouput is presented in video form by device 40, the arrangement of the present invention whereby unwanted augmentation in any one signal package within a CCD is reduced by a factor of P results in the displayed video signal being distorted to a level which is below the visual perception limit of humans. Thus, although the signal displayed by device 40 is in fact distorted in relation to the signal delivered by the detector 34 the humay eye does not distinguish this distortion and it therefore appears to the observer as undistorted. In the absence of the use of the present invention the distortion in the signal displayed by the device 40 would be clearly apparent as a spot or region of significantly different colour level from adjoining regions (on the black/white monochrome scale) and such line distortions could appear in the entire two-dimension picture displayed by device 40 with a two-dimensional significance arising from the juxtaposition of similar distortions on adjoining lines.

What is claimed is:

1. A signal processing system comprising an analogue shift register of the charge coupled type, clock means arranged for clocking samples of an input signal into the CCD shift register, for determining the storage time of the signal in the CCD shift register, and for clocking the signal out of the CCD shift register, wherein the number of samples of the input signal is less than the number of sites in the CCD shift register and during the storage time the clock means is arranged to clock the stored samples through at least some of the register sites unfilled during the clocking in period.

2. A system as claimed in claim 1, wherein the clock means is arranged to clock the stored samples during the storage time at a rate substantially less than for clocking the samples into or out of the CCD shift register.

3. A system as claimed in claim 1, wherein the clock means comprises three separate clocks, the first of which controls the rate of samples clocked into the CCD shift register, the second of which controls the rate of samples clocked through the shift register during the storage time, and the third of which controls the rate of samples clocked out of the CCD shift register.

4. A thermal imager comprising a scanner and a radiation detector the output of which detector is fed to a video device via a signal processing system as claimed in claim 1.

* * * * *